(12) United States Patent
Kong et al.

(10) Patent No.: US 8,811,458 B2
(45) Date of Patent: Aug. 19, 2014

(54) DIGITALLY CONTROLLED JITTER INJECTION FOR BUILT IN SELF-TESTING (BIST)

(71) Applicant: QUALCOMM Incorporated, San Diego, CA (US)

(72) Inventors: Xiaohua Kong, San Diego, CA (US); Zhi Zhu, San Diego, CA (US); Vannam Dang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/645,260

(22) Filed: Oct. 4, 2012

(65) Prior Publication Data

US 2014/0098843 A1     Apr. 10, 2014

(51) Int. Cl.
*H04B 1/38* (2006.01)
*H04L 5/16* (2006.01)

(52) U.S. Cl.
USPC ............................................. 375/219; 455/73

(58) Field of Classification Search
USPC ....................................................... 375/219
See application file for complete search history.

(56) References Cited

U.S. PATENT DOCUMENTS

| | | | |
|---|---|---|---|
| 5,793,822 A | 8/1998 | Anderson et al. | |
| 7,203,460 B2 | 4/2007 | Boose et al. | |
| 7,363,563 B1 | 4/2008 | Hissen et al. | |
| 7,388,937 B1 * | 6/2008 | Rodger et al. | 375/348 |
| 7,756,197 B1 | 7/2010 | Ferguson et al. | |
| 7,835,479 B2 | 11/2010 | Ishida | |
| 8,228,972 B2 | 7/2012 | Tonietto et al. | |
| 8,243,782 B2 | 8/2012 | Mobin et al. | |
| 8,300,684 B2 | 10/2012 | Mobin et al. | |
| 2005/0044463 A1 | 2/2005 | Frisch | |
| 2005/0075810 A1 * | 4/2005 | Laquai | 702/69 |
| 2005/0129104 A1 * | 6/2005 | Ishida et al. | 375/224 |
| 2005/0193290 A1 | 9/2005 | Cho et al. | |
| 2005/0243950 A1 * | 11/2005 | Laquai et al. | 375/326 |
| 2005/0271131 A1 | 12/2005 | Hafed et al. | |
| 2006/0285584 A1 | 12/2006 | Baumgartner et al. | |
| 2007/0147491 A1 | 6/2007 | Casper et al. | |

OTHER PUBLICATIONS

International Search Report and Written Opinion—PCT/US2013/063300—ISA/EPO—Nov. 21, 2013.

* cited by examiner

*Primary Examiner* — Erin File
(74) *Attorney, Agent, or Firm* — Paul S. Holdaway

(57) ABSTRACT

A digitally controlled jitter injection apparatus for built in self-testing includes a transceiver circuit having a transmitter circuit and a receiver circuit. The digitally controlled jitter injection apparatus also includes a generator that generates a composite jitter including multi-tone jitter components. The digitally controlled jitter injection apparatus also includes a processor operable to digitally inject the composite jitter into a receiver circuit and/or a transmitter circuit of the transceiver circuit.

20 Claims, 11 Drawing Sheets

DIGITALLY CONTROLLED JITTER INJECTION FOR BUILT IN SELF-TESTING (BIST)

TECHNICAL FIELD

The present disclosure relates generally to testing a device's jitter tolerance, and more particularly, to digitally controlled jitter injection for built in self-testing in a transceiver design.

BACKGROUND

In high-speed serial data communications, it is common practice to exchange data between first and second telecommunications systems. The first and second telecommunications systems may incorporate a serializer/deserializer (SERDES) circuit. In each SERDES circuit, a receiver is usually provided with a clock and data recovery (CDR) circuit for extracting a clock signal from incoming data. The performance of the CDR circuit is tied to its capacity to correctly recover transmitted data when a data period varies with time and/or when the data is subjected to jitter.

The jitter tolerance of the receiver, therefore, is significant when assessing a quality of the receiver data transfer. Jitter tolerance testing of high-speed SERDES circuits, however, is challenging. In particular, clock and data recovery testing of jitter tolerance is time consuming and difficult to represent under test.

The transmitter and receiver of transceiver circuits as well as the communication channel are sources of jitter within a communication system. For example, a transmitter may contribute jitter in the form of phase locked loop (PLL) random jitter, deterministic jitter and power noise injection. A deterministic jitter may be associated with a PLL, a clock tree, a data path, a driver and other similar elements of the communication system. The communication channel may provide jitter in the form of inter symbol interference based jitter, reflection, crosstalk, and power noise injection.

Conventionally, testing a receiver's jitter tolerance involves the use of measuring instruments and automated test equipment. Testing a receiver's jitter tolerance by this conventional method is an important but costly way of designing automated test equipment (ATE). To provide sufficient coverage for the receiver jitter tolerance performance, different jitter components and frequencies are introduced. The introduction of the different jitter components and frequencies, however, involves increased cost and complexity when implementing an ATE test of a receiver by externally injecting noise to a device under test (DUT).

SUMMARY

According to one aspect of the present disclosure, a digitally controlled jitter injection apparatus is described. The digitally controlled jitter injection apparatus includes a transceiver circuit. The digitally controlled jitter injection apparatus includes a generator configured to generate a composite jitter including multi-tone jitter components. The digitally controlled jitter injection apparatus includes a processor operable to digitally inject the composite jitter into a receiver circuit and/or a transmitter circuit of the transceiver circuit.

According to another aspect of the present disclosure, a method for self-testing a transceiver circuit is described. The method includes generating a composite jitter including multi-tone jitter components. The method also includes digitally injecting the composite jitter into a receiver circuit and/or a transmitter circuit of the transceiver circuit.

According to a further aspect of the present disclosure, a digitally controlled jitter injection apparatus is described. The digitally controlled jitter injection apparatus includes a transceiver circuit. The digitally controlled jitter injection apparatus also includes a means for generating a composite jitter including multi-tone jitter components. The digitally controlled jitter injection apparatus also includes a means for digitally injecting the composite jitter into a receiver circuit and/or a transmitter circuit of the transceiver circuit.

According to one aspect of the present disclosure, a computer program product for wireless communication in a wireless network includes a computer readable medium having non-transitory program code recorded thereon. The program code includes program code to generate a composite jitter including multi-tone jitter components. The program code also includes program code to digitally inject the composite jitter into a receiver circuit and/or a transmitter circuit of the transceiver circuit.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

Figure 1:
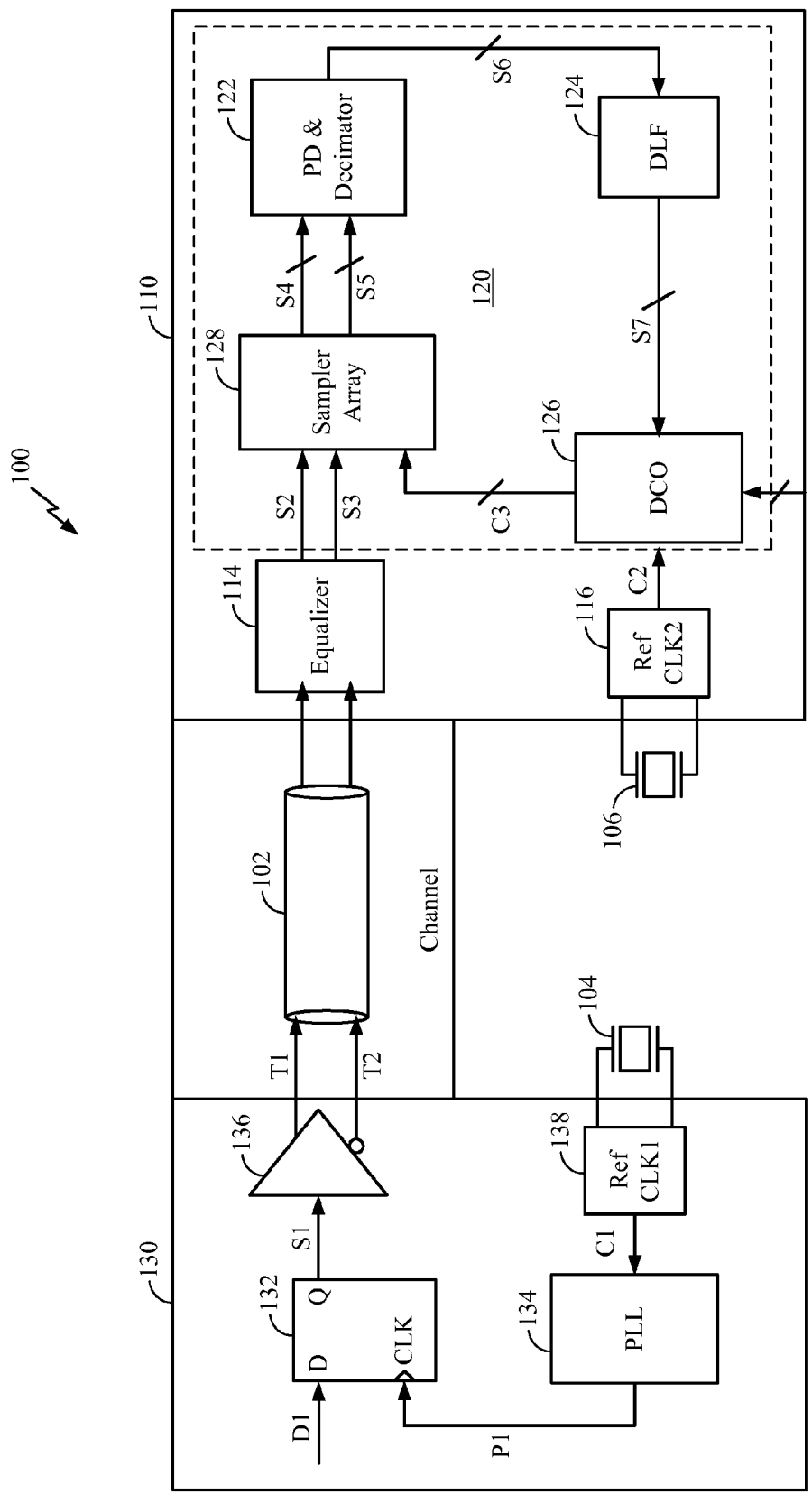
FIG. 1 is a block diagram illustrating a communication system including a receiver circuit and a transmitter circuit for receiving and transmitting bit streams over a communication channel.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Some aspects of the disclosure describe a digitally controlled jitter injection system and method for built in self-testing of clock data recovery jitter tolerance performance in transceiver designs. In one aspect of the present disclosure, a transceiver device incorporates a look-up table based jitter injection implementation for jitter tolerance testing. Other implementations including, but not limited to, a software implementation, a digital signal processing implementation, and other similar implementations are incorporated in a system and method to generate a jitter pattern that may be implemented in a look-up-table (LUT). The jitter pattern in the look-up-table may be based on a frequency domain and/or a phase domain within a transceiver circuit. The composite jitter from the jitter patterns of the LUT may be injected into a transmit clock generation section of a transceiver device. The composite jitter may also be injected into a receiver clock data recovery section (e.g., a loopback configuration) of a receiver of the transceiver device. For example, an existing loopback configuration may be implemented within a clock data recovery section to provide look-up table based jitter tolerance testing.

In one aspect of the disclosure, a processor of the digitally controlled jitter injection system injects the composite jitter, including multi-tone jitter components into a receiver of a transceiver device. The multi-tone jitter components may also be injected into a transmitter of the transceiver device. The tones of the multi-tone jitter components may include different jitter components, phases, and frequencies. The multi-tone jitter components may be based on incoming data that includes multi-tone signals. In wireless communications, incoming data signals (e.g., a series of symbols) are frequently modulated on a carrier signal (e.g., a carrier tone) having a particular tone frequency. To increase the amount of data that is transmitted in a given period of time, different carriers are used to transmit data (e.g., symbols) in parallel. This results in the broadcasting of what is known as a multi-tone signal. One aspect of the present disclosure forms composite jitter that includes multi-tone jitter components composed of, for example, different jitter components, phases and frequencies.

FIG. 1 is a block diagram illustrating a communication system 100 including a receiver circuit 110 and a transmitter circuit 130 for receiving and transmitting bit streams over a communication channel 102. The transmitter circuit 130 may include, but is not limited to, a phase locked loop (PLL) 134, a flip-flop (e.g., D flip flop) 132, an output driver 136 (e.g., an amplifier), a reference clock device 138, and a frequency source (e.g., a crystal) 104. The flip-flop 132 delivers a signal S1 (e.g., a serial data stream) to the output driver 136. The reference clock device 138 generates a reference clock C1 based on a frequency of the crystal 104. The PLL 134 receives the reference clock C1 and outputs a PLL signal P1 to the flip-flop 132. The flip-flop 132 also receives data D1 from a data source. The output driver 136 delivers a differential output signal (T1, T2) to the receiver circuit 110 via the communication channel 102.

The receiver circuit 110 may include a clock and data recovery (CDR) loop 120. The CDR loop 120 may include a sampler array 128, a phase detector (PD) and decimator 122, a digitally controlled oscillator (DCO) 126, and a digital loop filter (DLF) 124. A decimator of the PD and decimator 122 may be implemented to reduce the number of samples in the incoming data. A front end of the receiver circuit 110 includes an equalizer 114 to receive incoming data (e.g., differential signals T1 and T2) from the communication channel 102. A reference clock device (RefCLK2) 116 generates a clock output signal C2 to the DCO 126. The clock output signal C2 may be based on a frequency of a frequency source (e.g., a crystal) 106.

Representatively, the reference clock device 116 and the crystal 106 enable tuning of the DCO 126 to a target frequency, which corresponds to a target data rate. The target data rate may be a known data rate of the incoming data from the communication channel 102. The CDR loop 120 may track a phase of the incoming data and adjust the DCO 126 to maintain a lock onto the phase of the incoming data. The phase detector and decimator 122 maintains a phase alignment between the recovered clock C3 and the incoming data by maintaining a phase lock on the incoming data.

The sampler array 128 receives equalized incoming data S2 and S3 from the equalizer 114 and the recovered clock C3 from the DCO 126. The sampler array 128 samples bits of the differential input signals S2 and S3 with the recovered clock C3. The phase detector and decimator 122 adjusts the DCO 126 through the DLF 124 to maintain the lock onto a phase of the incoming data based on a phase of the differential signals S4 and S5 received from the sampler array 128. For example, a phase adjusted output signal S6 from the phase detector and decimator 122 is filtered at the DLF 124, which outputs a digitally filtered frequency control signal S7 to the DCO 126.

As shown in FIG. 1, the phase adjusted output signal S6 is used for a phase error implementation by feeding the phase adjusted output signal S6 into the DLF 124 to further adjust the phase of the DCO 126. The phase adjusted output signal S6 directs the DCO 126 to either speed up or slow down to adjust the phase of the recovered clock C3 from the DCO 126. In particular, the frequency control signal S7 of the DLF 124 provides a signal phase up/phase down to speed up or slow down the recovered clock C3. Accordingly, the phase detector and decimator 122 checks the alignment between the recovered clock generated by the DCO 126 and the incoming data. During operation, the transmitter circuit 130, the receiver circuit 110, and the communication channel 102 contribute jitter to the communication system 100.

Figure 2:
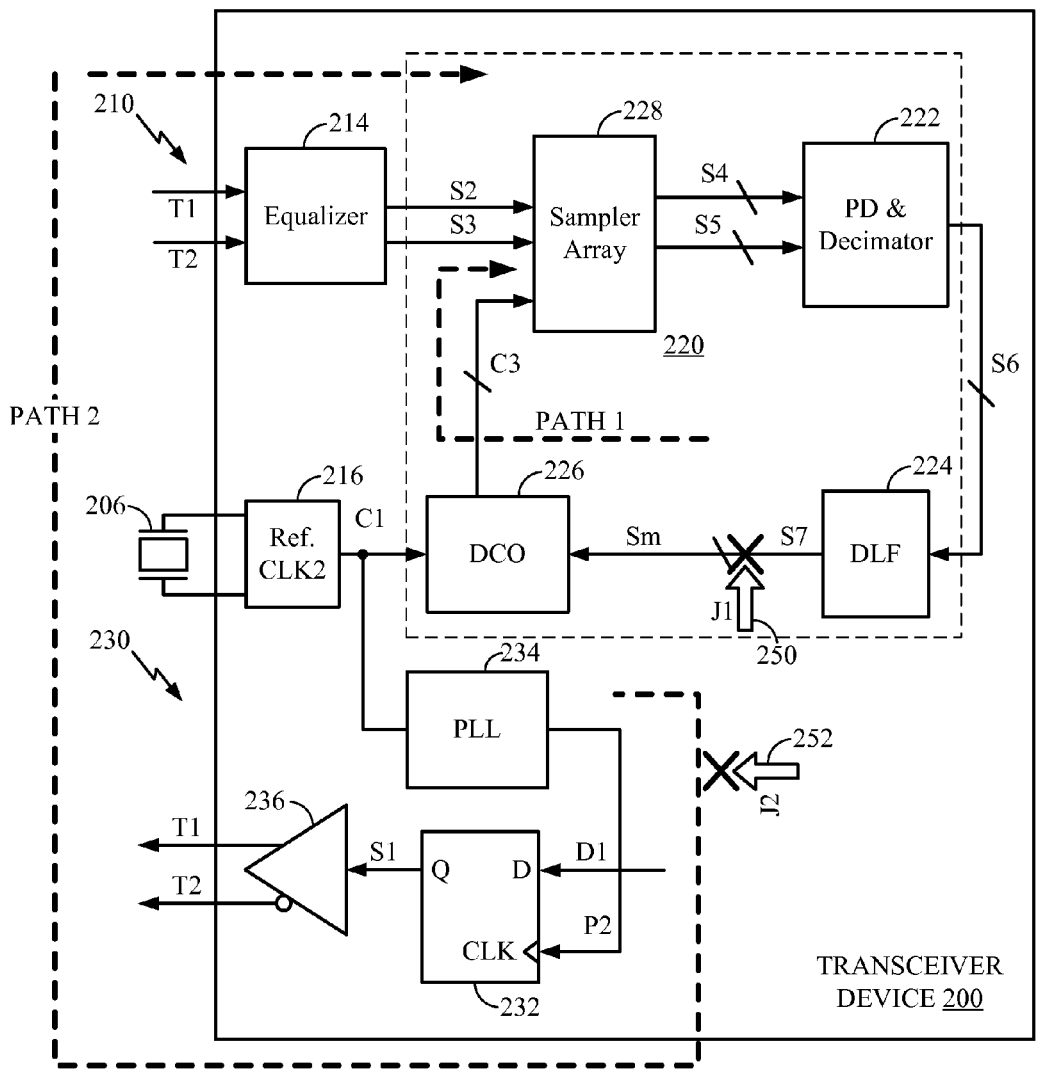
FIG. 2 is a block diagram illustrating a transceiver device including built in self-testing for digitally controlled jitter injection according to one aspect of the present disclosure.

FIG. 2 is a block diagram illustrating a transceiver device 200 including built in self-testing for digitally controlled jitter injection according to one aspect of the present disclosure. The built in self-testing for digitally controlled jitter injection may be implemented in the transceiver device 200 including a transmitter circuit 230 and a receiver circuit 210. The transmitter circuit 230 and the receiver circuit 210 may operate in a manner similar to the transmitter circuit 130 and the receiver circuit 110 of FIG. 1.

Referring again to FIG. 2, the transmitter circuit 230 includes a PLL 234, a flip-flop 232, an output driver 236, a reference clock device 216, and a frequency source (e.g., a crystal) 206. In this configuration, the reference clock device 216 and the crystal 206 are shared between the transmitter circuit 230 and the receiver circuit 210. The receiver circuit 210 includes a CDR loop 220. The CDR loop 220 may include a sampler array 228, a phase detector (PD) and decimator 222, a digitally controlled oscillator (DCO) 226, and a digital loop filter (DLF) 224. A front end of the receiver circuit 210 includes an equalizer 214 to receive the incoming data (e.g., differential signals T1, T2) from a communication channel (e.g., communication channel 102).

In operation, the transceiver device 200 may experience jitter from the transmitter circuit 230, the receiver circuit 210 and a communication channel due to the loop-back communication path (see, PATH 2) between the transmitter circuit 230 and the receiver circuit 210. To accommodate for errors due to jitter, a built in self test operation may be implemented in which composite jitter is generated by a digitally controlled jitter signature generator. The composite jitter may be injected into one or more communication path injection points of the transceiver device 200 to determine a transceiver jitter tolerance. The injection points may be selected to impact transmit clock generation and receive clock generation within the transceiver device 200.

In one aspect of the disclosure, a first jitter injection point 250 may be associated with a first communication path (PATH 1) of the receiver circuit 210. In this aspect of the disclosure, a second jitter injection point 252 may be associated with a second communication path (PATH 2) of the transmitter circuit 230. The first jitter injection point 250 may be between the DCO 226 and the DLF 224 to provide a first jitter injection J1 of composite jitter. The second jitter injection point 252 may be between the PLL 234 and the flip-flop 232 to provide a second jitter injection J2 of composite jitter.

As shown in FIG. 2, a modulated (e.g., frequency or phase) control signal Sm may be received at the DCO 226. The modulated control signal Sm may be generated by modulating a frequency and/or phase domain based composite jitter J1 onto a digitally filtered frequency control signal S7. A modulated control signal P2 may be received at the flip-flop 232. The modulated control signal P2 may be generated by modulating the frequency and/or phase domain based composite jitter J2 onto the output P2 of the PLL 234 of the transmitter circuit 230.

In one configuration, the jitter injections J1 and J2 are generated based on a software, firmware and/or hardware implementation along with a look-up table of jitter parameters to facilitate jitter performance testing within the transceiver device 200. To lower cost and reduce overhead, the built in self-test operation may be implemented digitally. For example, a digitally controlled jitter signature generator may be configured to generate a jitter parameter (e.g., a desired jitter error correction signal) to improve jitter tolerance performance of the transceiver device 200.

Figure 3:
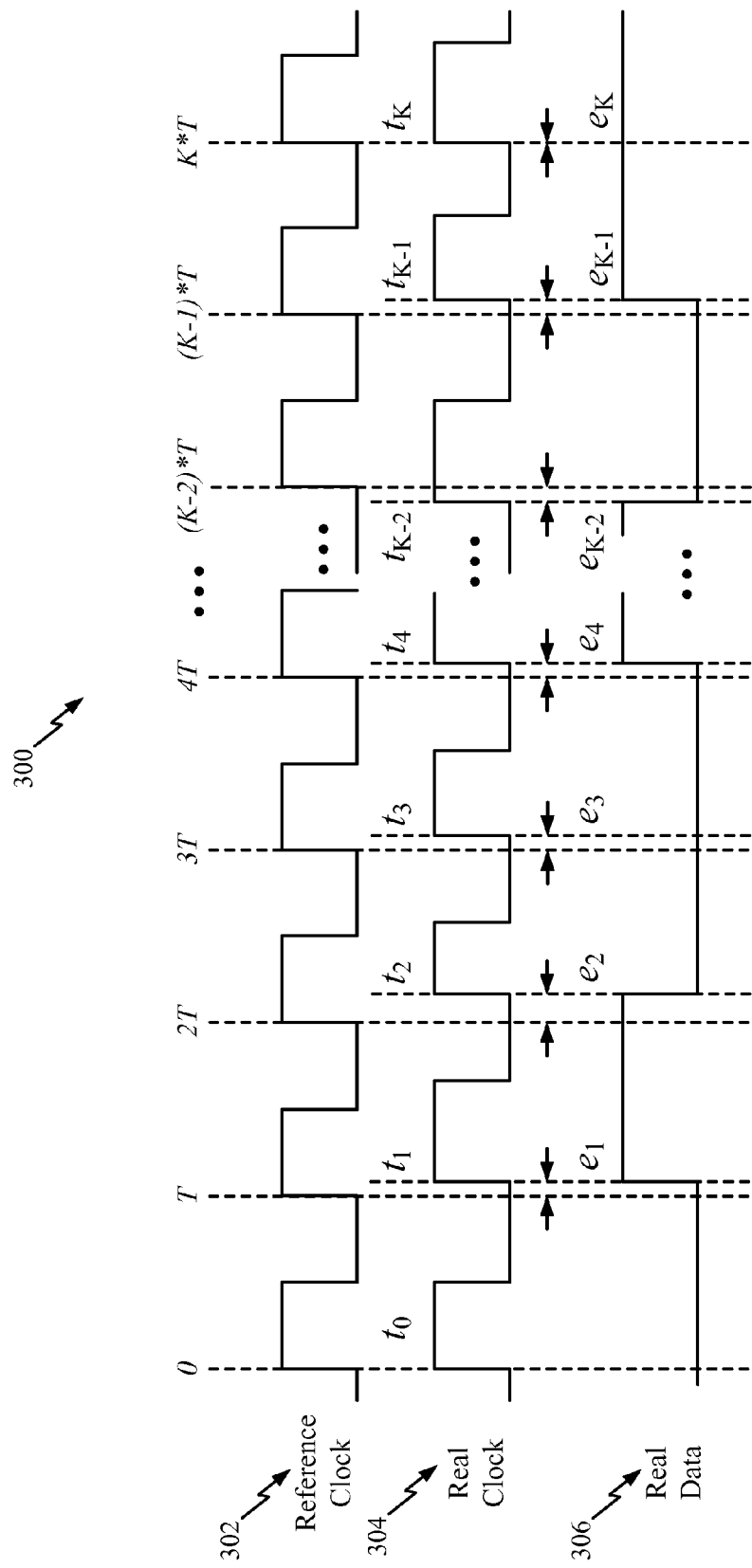
FIG. 3 is an exemplary diagram of waveforms illustrating clock and data timing interval errors associated with jitter.

FIG. 3 is an exemplary diagram of a conceptual graph 300 defining jitter with respect to a timing interval error (TIE) that is described with reference to FIG. 2. A reference clock 302 (e.g., an ideal clock) signal may be associated with a reference clock device (RefCLK) 216. In one configuration, the reference clock 302 signal is based on a phase locked loop (PLL) implementation within a clock data recovery circuit, such as the CDR loop 220. Real data 306 may be associated with a real clock 304.

As shown in FIG. 3, jitter may be defined as the difference in the transitions between the real clock 304 and the reference clock 302 signals. When the real clock 304 generates the real data 306, the corresponding disparity between the real data 306 relative to the reference clock 302 signal is referred to as data jitter. Therefore, every transition of the real data 306 may be associated with the reference clock 302 signal and the real clock 304. The difference may be referred to as the timing interval error of the data. In particular, the timing interval error is a time difference between the real data 306 transitions relative to the reference clock 302 signal, as shown in the conceptual graph 300. Thus, the timing interval error can be modeled as a sample of jitter in conjunction with a reference clock (e.g., reference clock 302 signal).

After incoming data (e.g., real data 306) is received at the receiver circuit 210, an edge detector (not shown), for example, identifies the real data 306 edges that may correspond to the real clock 304 edges. The real data 306 edges may be assigned to symbol transition locations. For example, the real data 306 edge locations may correspond to the edge locations $t_0, t_1, t_2, t_3, t_4, \ldots, t_{K-2}, t_{K-1}$, and $t_K$. The reference clock 302 signal edge locations may correspond to the reference clock edge locations 0, T, 2T, 3T, 4T, ..., (K−2)*T, (K−1)*T, K*T. The (signed) differences between the real clock 304 edge locations and the reference clock 302 signal edge locations are the timing interval error.

As illustrated in the conceptual graph 300, the real clock 304 may lag the reference clock 302 signal in some locations, (e.g., in locations corresponding to period T, 2T, etc.), and may lead the reference clock 302 signal in others, (e.g., in locations corresponding to period (K−2)*T). Although there are no transitions at certain locations of the real data 306, such as 3T and K*T, the timing interval error values can be obtained based on the real clock 304 and the reference clock 302 signals or any other system for determining timing interval error values. When a statistical description of the jitter is measured, a corresponding probability distribution function of the jitter can be derived. When there are enough sources of jitter, the statistical interpretation may be a Gaussian type distribution of the jitter.

Figure 4:
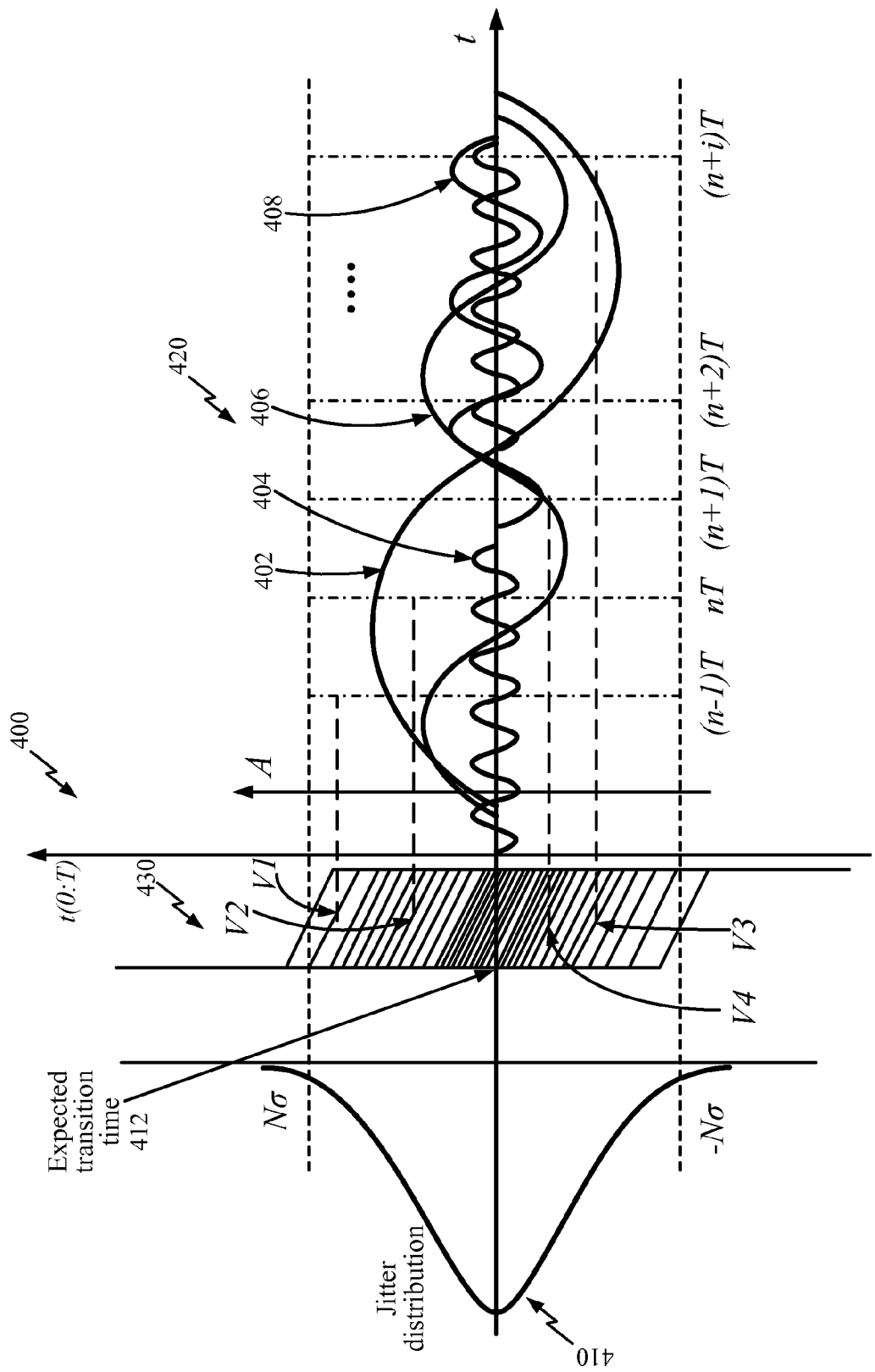
FIG. 4 is a conceptual graph illustrating a Gaussian type probability distribution function representing a measurement or calculation of jitter parameters juxtaposed with a corresponding continuous time Fourier transform of the jitter measurements.

FIG. 4 is a conceptual graph 400 illustrating a Gaussian type probability distribution function 410 representing measurements or calculations of jitter juxtaposed with a corresponding continuous time Fourier transform 420 of the jitter measurements. The jitter parameters may be phase and/or frequency domain representations of jitter, multi-tone jitter components, and/or jitter signals. The probability distribution function 410 represents a distribution of the jitter, which is decomposed as a Fourier transform 420 associated with a series of different frequencies of jitter. For example, the x-axis of the Fourier transform 420 represents time (t) and the y-axis represents an amplitude (A) of the jitter components represented by multi-tone jitter components 402, 404, 406, and 408 in a time domain.

As shown in FIG. 4, the multi-tone jitter components 402, 404, 406, and 408 operate at different frequencies and different amplitudes and contribute to the jitter represented in the probability distribution function 410. For example, the frequencies of the jitter components can create a deviation of the timing interval error distribution in the probability distribution function 410. The time (t) may represent a periodic time, e.g., periodic time (n−1)T, nT, (n+1)T, (n+2)T, . . . , (n+i)T, associated with the reference clock (e.g., reference clock 302 signal).

As noted, each data transition of incoming data is subject to jitter, which is characterized by the probability distribution function 410. For a reference clock 302 signal, a real transition of the real data 306 may be distributed away from an expected transition time 412. This deviation in the real transition from the expected transition time 412 represents jitter and is a result of deviations during a real clock transition with respect to a reference clock transition. The diagram 430 represents a sample of the deviations in a real transition from an expected transition time 412.

In one aspect of the present disclosure, a mathematical representation of jitter may be calculated and digitized. For example, a total jitter value may be defined at different points in time by analyzing the time domain of different frequency components of the jitter (e.g., multi-tone jitter components 402, 404, 406, and 408). Sampling each frequency component with the reference clock 302 signal defines a sample of the jitter values (e.g., V1, V2, V3, and V4) associated with the corresponding periodic times (e.g., (n−1)T, nT, (n+1)T, . . . , (n+i)T). The jitter values (e.g., V1, V2, V3, and V4) represent the deviation in the real transition from the expected transition time 412. The value(s) of the sample represent a total jitter at a given point in time. In addition, the total jitter can be a composition of different jitter sources with different frequencies and amplitudes.

A digitally controlled jitter injection system may be implemented based on the mathematical calculation and digitization of jitter within a communication system. In one aspect of the present disclosure, the composite jitter may be injected into a transmit clock generation section of a transmitter circuit and/or a receiver clock and data recovery loop of a receiver circuit to rigorously test the jitter tolerance of a transceiver device 200, as shown in FIG. 2. The composite jitter may be a phase domain based jitter signal and/or a frequency domain based jitter signal. The composite jitter may be injected in multiple locations of the transceiver device 200. In one aspect of the disclosure, the composite jitter may be implemented according to look-up tables such as a phase domain based look-up table or a frequency domain based look-up table. The look-up tables may include different domain parameters of jitter and/or corresponding time values that may be injected into the transceiver device 200. The composite jitter may be injected into one or more locations of the transceiver device 200 to provide a transceiver design that compensates for different sources of jitter within a communication system.

In one aspect of the disclosure, frequency and phase domain based jitter generation may be implemented according to a local jitter injection implementation. In this aspect, a digitally controlled jitter signature generator may generate a composite jitter. The digitally controlled jitter signature generator may be implemented by a pre-defined look-up table (LUT), a processor (e.g., a digital signal processor), and a software and/or a firmware implementation. The digitally controlled jitter signature generator may be implemented within pre-existing components of a host system including, for example, the receiver circuit 210 and the transmitter circuit 230 of the transceiver device 200, as shown in FIG. 2, using the preexisting components of the host system.

Figure 5:
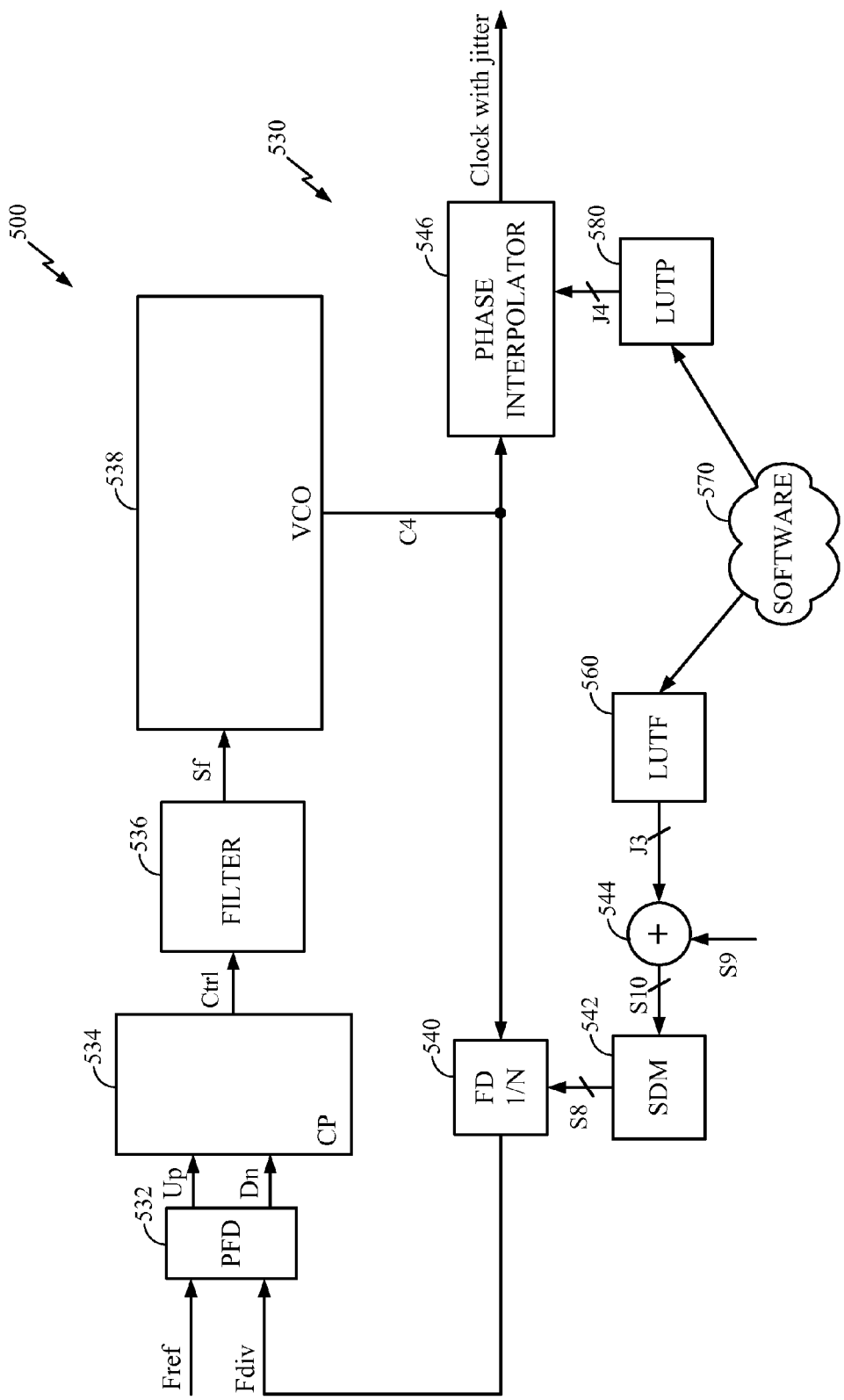
FIG. 5 illustrates an exemplary forward transmit jitter injection implementation on a transmitter of a digitally controlled jitter injection system according to one aspect of the present disclosure.

FIG. 5 illustrates a forward transmit jitter injection implementation within a transmitter circuit 530 of a jitter injection system 500 according to one aspect of the disclosure. Representatively, the jitter injection system 500 is a digitally controlled, PLL (phase locked loop) implementation based on a phase frequency detector (PFD) 532, a charge pump (CP) 534, a filter 536, and a voltage controlled oscillator (VCO) 538. In this configuration, the VCO 538 receives a filtered control signal (Sf) from the filter 536 to provide an output signal C4. In this aspect of the disclosure, the jitter injection system 500 and the transmitter circuit 530 further illustrate the transmitter circuit 230 and the second jitter injection point 252 associated with PATH 2 illustrated in FIG. 2. PATH 2 of FIG. 2 refers to a communication path associated with the transmitter circuit 230 of the transceiver device 200. The jitter injection point 252 of the transmitter circuit 230 corresponds to the output of the PLL 234 of FIG. 2, whereas the jitter injection point of the jitter injection system 500 corresponds to an output of the VCO 538.

In this configuration, a frequency divider (FD) 540 divides a frequency of the output signal C4 from the VCO 538 by an output signal S8 from a sigma delta modulator (SDM) 542. The sigma delta modulator (SDM) 542 controls the operation of the frequency divider 540. In the PLL implementation shown in FIG. 5, a reference frequency signal Fref may be generated by a reference clock device 216 in conjunction with a frequency source such as a crystal 206, for example, as shown in FIG. 2.

Referring again to FIG. 5, the phase detector 532 detects a phase difference between the reference frequency signal Fref and a divided frequency signal Fdiv from the frequency divider 540. The frequency divider 540 divides a frequency of the output signal C4 from the VCO 538 and generates the divided frequency signal Fdiv. The charge pump 534 operates based on output signals Up and Dn of the phase detector 532 to generate a control signal Ctrl that is filtered by the filter 536. The VCO 538 generates the output signal C4 based on the filtered control signal Sf according to the PLL based forward transmit jitter injection implementation of the jitter injection system 500 shown in FIG. 5.

The forward jitter injection implementation of the jitter injection system 500 uses both a frequency domain look up table (LUTF) 560 and a phase domain look up table (LUTP) 580, as well as a phase interpolator 546. The phase interpolator 546 allows the transceiver to adjust a phase of its sampling clocks in fine increments. In this configuration, the look-up tables, LUTF 560 and LUTP 580, are populated by software 570 executed by, for example, a digital signal processor (DSP) of the host system for calculation of the composite jitter. In this configuration, the software 570 provides a digitally controlled jitter signature generator by storing digitally generated composite jitter with the LUTF 560 and LUTP 580.

In an alternative configuration, a digitally controlled jitter signature generator may be based on a single look-up table where the single look-up table includes jitter parameters that can be converted from a phase domain to a frequency domain and vice versa. The composite jitter values (J3 and J4) from the look-up tables (i.e., LUTF 560 and/or LUTP 580) may be driven into any other injection points to facilitate jitter tolerance testing. For example, the composite jitter values may be driven into the second jitter injection point 252 of the second communication path (PATH 2), as shown in FIG. 2.

The look-up tables LUTF 560 and LUTP 580 may include composite jitter values to facilitate jitter tolerance within a transceiver device. The composite jitter values may be defined based on the actual jitter of a system, such as a host system including a transceiver device 200, as shown in FIG. 2. A mathematical representation of the actual jitter can be digitized to facilitate jitter injection based on the look-up tables LUTF 560 and LUTP 580. The look-up tables may enable various noise combinations when the LUTF 560 and the LUTP 580 are populated by executing the software 570 within a digital signal processor.

Jitter generation in accordance with the forward jitter injection implementation of FIG. 5 incorporates one or more forward jitter signal injection points. The forward jitter signal injection points may be defined by a point of reception of a jitter parameter associated with the LUTF 560 and/or the LUTP 580. Frequency modulation based on the LUTF 560 mimics a frequency offset between the transmitter circuit 530 and the receiver circuit (e.g., receiver circuit 210 of FIG. 2). The frequency offset may include frequency modulation such as spread spectrum clock signaling. In one aspect of the disclosure, jitter generation may be associated with the LUTF 560 when the determined jitter is of a very low frequency and a large amplitude. For example, frequency modulation based on the LUTF 560 for generating low frequency and large amplitude jitter mimics a power generation system. LUTF 560 implementation also increases the margin of operation of the LUTP 580 injection path, thereby allowing the testing of higher amplitude or frequency/phase jitter. The look-up tables, LUTF 560 and LUTP 580, may be strategically placed within the jitter injection system 500 to facilitate jitter generation. In this configuration, the LUTF 560 is positioned to the right of the LUTP 580 to facilitate the jitter generation. Because a phase domain based jitter associated with LUTP 580 is an integration of frequency, the injection of jitter can be mathematically partitioned between the LUTP 580 and LUTF 560.

For example, a data source with frequency offset, $\Delta f(t)$, and jitter source with two tones represented as phase shift (i.e., from ideal phase) can be represented as a summation of phase shift over time as follows:

$$\int \Delta f(t)dt + Ph1(t) + Ph2(t), \text{ where, } Ph1(t) \text{ and } Ph2(t) \text{ represent jitter}$$

The summation may can also be represented as:

$$\int \Delta f(t)dt + \int [d(Ph1(t))/dt]dt + Ph2(t) = \int \Delta f(t)dt + \int f1(t)dt + Ph2(t) = \int [\Delta f(t) + \Delta f1(t)]dt + Ph2(t), \text{ where } \int [\Delta f(t) + \Delta f1(t)]dt \text{ represents frequency modulation based on LUTF 560 and Ph2}(t) \text{ represents phase modulation abased on LUTP 580.}$$

The representation can be applied to multiple frequency/phase offset.

In one aspect of the present disclosure, the SDM 542 may receive a summed signal S10 from an adder 544, where the summed signal S10 is based on a jitter injection of a composite jitter J3 from the LUTF 560 and a signal S9. Frequency modulation by LUTP 580 may be based on the signal S9, which corresponds to an original frequency for generating a desired frequency of a phase locked loop. A parameter of the composite jitter J3 may be generated by the software 570 associated with the LUTF 560. The signal S8, which is based on the injection of the composite jitter J3, controls a division ratio of the frequency divider 540.

As further illustrated in FIG. 5, a composite jitter J4 from the LUTP 580 is injected in the phase interpolator 546. Because the LUTP 580 implements a periodic time versus jitter look-up table, a phase of the final output C4 of the VCO 538 can be modulated through the phase interpolator 546 to generate a clock signal with jitter. When the clock signal with jitter generates data within a loop back to a receiver circuit (e.g., receiver circuit 210 of FIG. 2), the receiver circuit sees a jitter injection that is different and adjusted to provide enhanced jitter tolerance testing. The jitter injection system 500 affords improved freedom of implementation because of a reduction in complexity and cost by using the software based implementation of FIG. 5.

Figure 6:
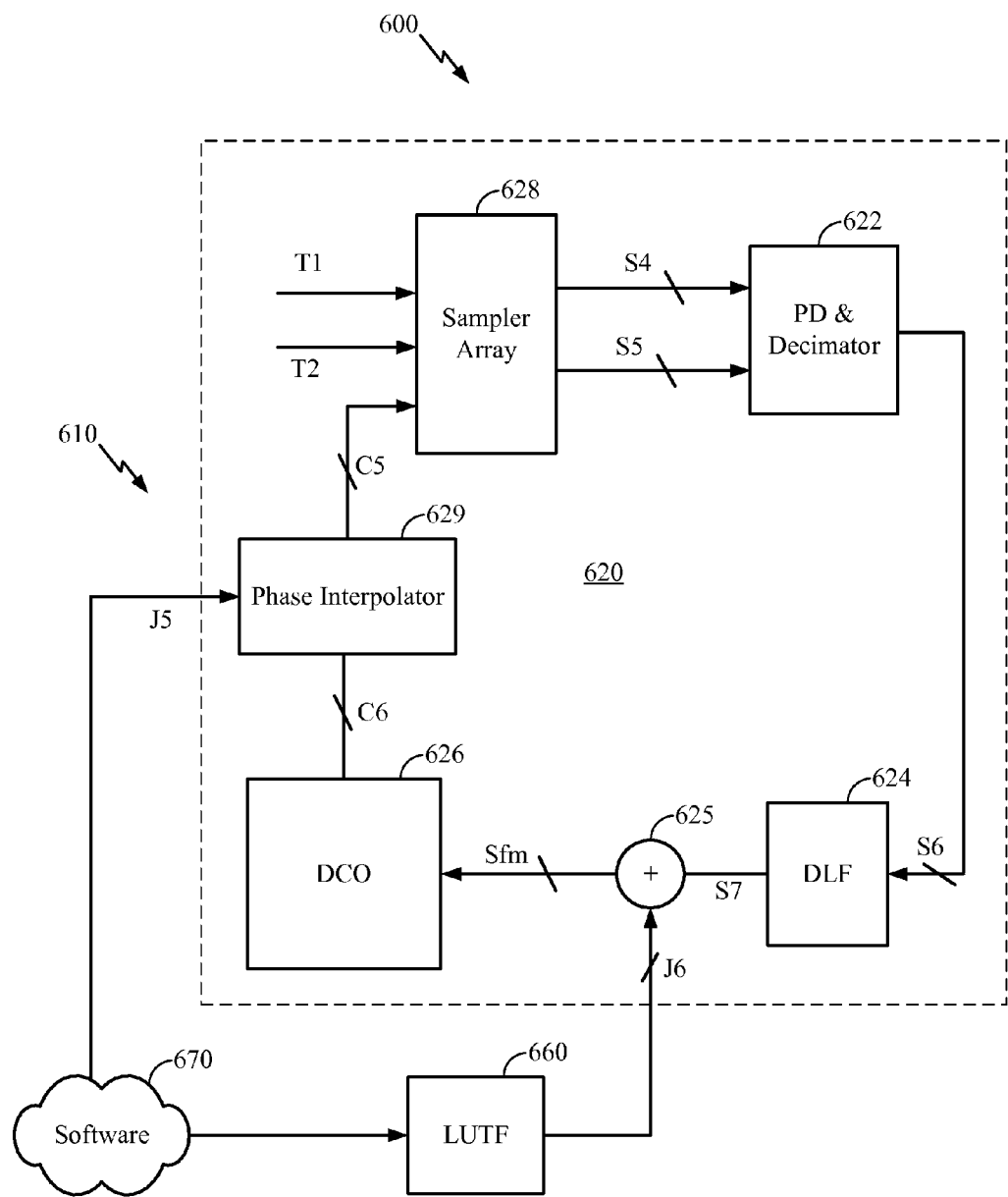
FIG. 6 illustrates an exemplary local jitter injection implementation on a receiver of a digitally controlled jitter injection system according to one aspect of the present disclosure.

FIG. 6 illustrates a local receiver jitter injection implementation within a receiver circuit 610 of a jitter injection system 600 according to one aspect of the present disclosure. The receiver circuit 610 may be similar to the receiver circuit 210, such that jitter injection is provided at the first jitter injection point 250 associated with PATH 1 illustrated in FIG. 2. In this configuration, the receiver circuit 610 includes a digitally controlled receiver clock data recovery (CDR) loop 620. A look-up table of composite jitter values (e.g., a frequency domain look up table (LUTF) 660) can be driven into the receiver CDR loop 620 at any desired jitter injection point to facilitate improved jitter tolerance testing.

The receiver CDR loop 620 may be implemented with a sampler array 628 that receives the differential incoming data T1 and T2. A phase detector (PD) and decimator 622 receives the sampled signals S4 and S5 from the sampler array 628, and a DLF (digital loop filter) 624 receives a phase adjusted output signal S6 from the phase detector (PD) and decimator 622. Although the local jitter injection implementation is based on the receiver CDR loop 620, in an alternative configuration, the local jitter injection implementation of FIG. 6 can also be accomplished with a PLL based clock and data recovery loop.

The local jitter injection implementation within the receiver CDR loop 620 executes the software 670 to populate the LUTF 660 for supplying composite jitter (J5 and J6) to a phase interpolator 629 and an adder 625, respectively. In one aspect of the disclosure, the sampler array 628 may not distinguish jitter from the incoming data (T1 and T2) or jitter associated with a recovered clock C5 from the phase interpolator 629. As a result, the local jitter injection into the receiver CDR loop 620 is equivalent to a digitally controlled jitter injection into the differential incoming data (T1 and T2) in this configuration.

In one configuration, the DLF 624 provides digital control of the receiver CDR loop 620. The DLF 624 generates a digitally filtered frequency control signal S7 to control a digitally controlled oscillator (DCO) 626. A modulated (e.g., frequency and/or phase) recovered clock C5 may be received at the sampler array 628. The modulated, recovered clock C5 may be generated by modulating the phase or frequency domain based composite jitter J5 onto a digitally controlled clock C6 from the DCO 626. A frequency modulated control signal Sfm may be received at the DCO 626. The frequency modulated control signal Sfm may be generated by modulating the frequency domain based composite jitter J6 onto a digitally filtered frequency control signal S7. In one configuration, the DCO 626 is incorporated within a phase interpolator, for example, as shown in FIG. 7.

In one aspect of the disclosure, the jitter injection system 600 is separated into a frequency domain and a phase domain. A frequency domain based jitter generation associated with the LUTF 660 may be separate from a phase domain based jitter generation associated with the phase interpolator 629, using, for example, a phase domain look up table (LUTP). In one configuration, the jitter injection may be based on an explicit injection where the incoming data is digitally injected with a composite jitter. In another configuration, the jitter injection can be based on an implicit injection where a composite jitter J5 from a digital controlled jitter signature generator (e.g., software 670) is injected into the phase interpolator 629. The explicit and the implicit implementations are adequate because they both address the phase difference between the incoming data (T1 and T2) and a recovered clock C5.

Figure 7:
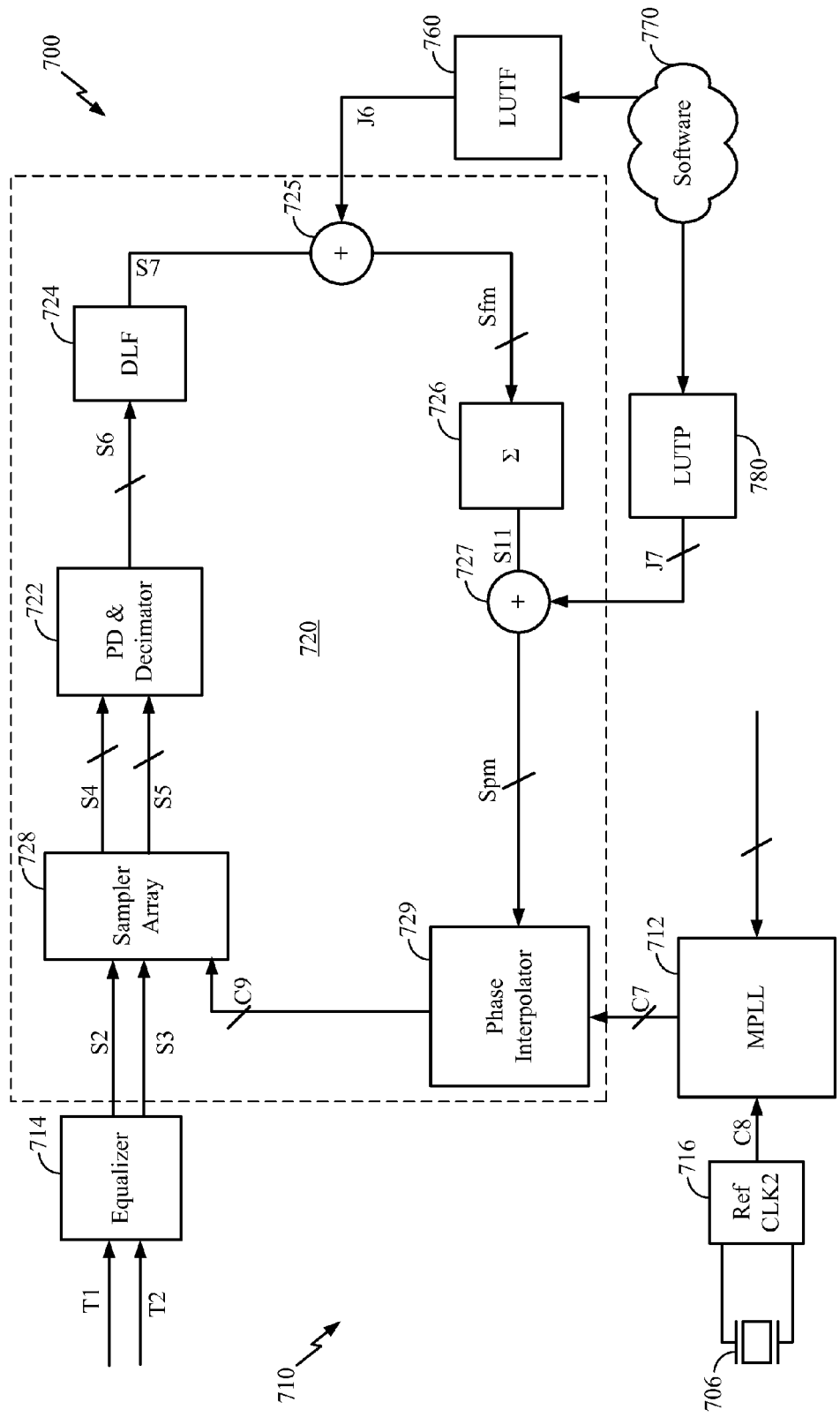
FIG. 7 is a block diagram further illustrating the local jitter injection implementation of FIG. 6 according to one aspect of the present disclosure.

FIG. 7 further illustrates the local jitter injection implementation of FIG. 6 within a receiver circuit 710 of a jitter injection system 700 according to one aspect of the disclosure. The local jitter injection implementation of FIG. 7 is implemented within a phase interpolator based clock and data recovery (CDR) loop 720. Representatively, software 770 populates a frequency domain look up table (LUTF) 760 and a phase domain look up table (LUTP) 780 to enable the injection of composite jitter J6 and J7 into the CDR loop 720. The CDR loop 720 includes a sampler array 728, a phase detector (PD) and decimator 722, a DLF (digital loop filter) 724, adders 725 and 727, an integrator 726 and a phase interpolator 729. In this configuration, digitally controlled oscillator functionality is provided by the phase interpolator 729, a multi-phase phase-locked loop (MPLL) 712, a reference clock device 716, and a frequency source 706. The multi reference MPLL 712 generates a high-speed clock frequency C7 and phase locks the clock C7 to a reference clock C8 derived from the reference clock device 716.

The sampler array 728 receives equalized incoming data S2 and S3 from the equalizer 714 and the recovered clock C9 from the phase interpolator 729. The sampler array 728 samples bits of the differential input signals S2 and S3 with the recovered clock C9. The phase detector and decimator 722 generates an adjusted output signal S6 based on a phase of differential signals S4 and S5 received from the sampler array 728 to maintain a lock onto a phase of the incoming data. The phase adjusted output signal S6 from the phase detector and decimator 722 is filtered at the DLF 724, which outputs a digitally filtered frequency control signal S7. A frequency modulated control signal Sfm may be generated by modulating a frequency domain based composite jitter J6 onto a digitally filtered frequency control signal S7 from the DLF 724. The control signal Sfm may be combined with other signals (not shown) at the integrator 726, which may be implemented as a summer, to generate a summed phase control S11. In addition, a phase modulated control signal Spm may be generated by modulating a phase domain based composite jitter J7 onto the summed phase control S11. The phase interpolator 729 generates a recovered clock C9 based on the high-speed clock frequency C7 and phase modulated control signal Spm applied to the phase interpolator 729. The recovered clock C9 includes an interpolated phase controlled with the phase modulated control signal Spm. The recovered clock C9 can be generated by interpolation techniques performed by phase interpolator 729.

Figure 8:
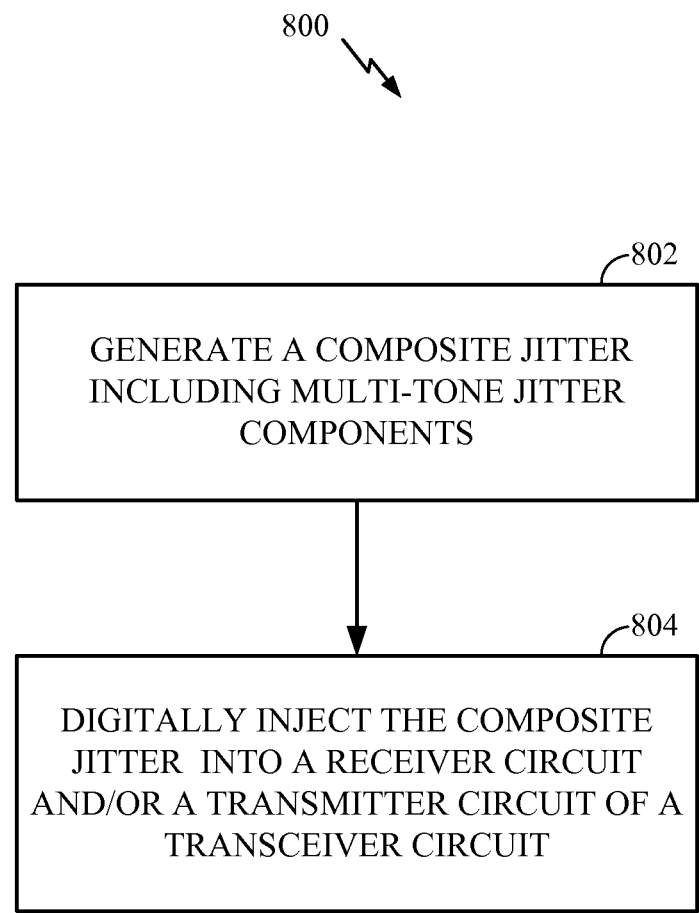
FIG. 8 illustrates a method of self-testing a transceiver circuit according to an aspect of the present disclosure.

FIG. 8 illustrates a method 800 for self-testing a transceiver circuit according to an aspect of the present disclosure. At block 802, a composite jitter, including multi-tone jitter components, is generated. For example, as shown in FIG. 7, the composite jitter J6 and/or J7 are generated by executing the software 770 to populate the corresponding LUTF 760 and/or LUTP 780 with composite jitter. At block 804, the composite jitter is digitally injected into the receiver or transmitter circuit of the transceiver circuit. In the illustration of FIG. 7, the composite jitter J6 and/or J7 are injected into the receiver circuit 710 using the software 770 and the LUTF 760 and the LUTP 780.

Figure 9:
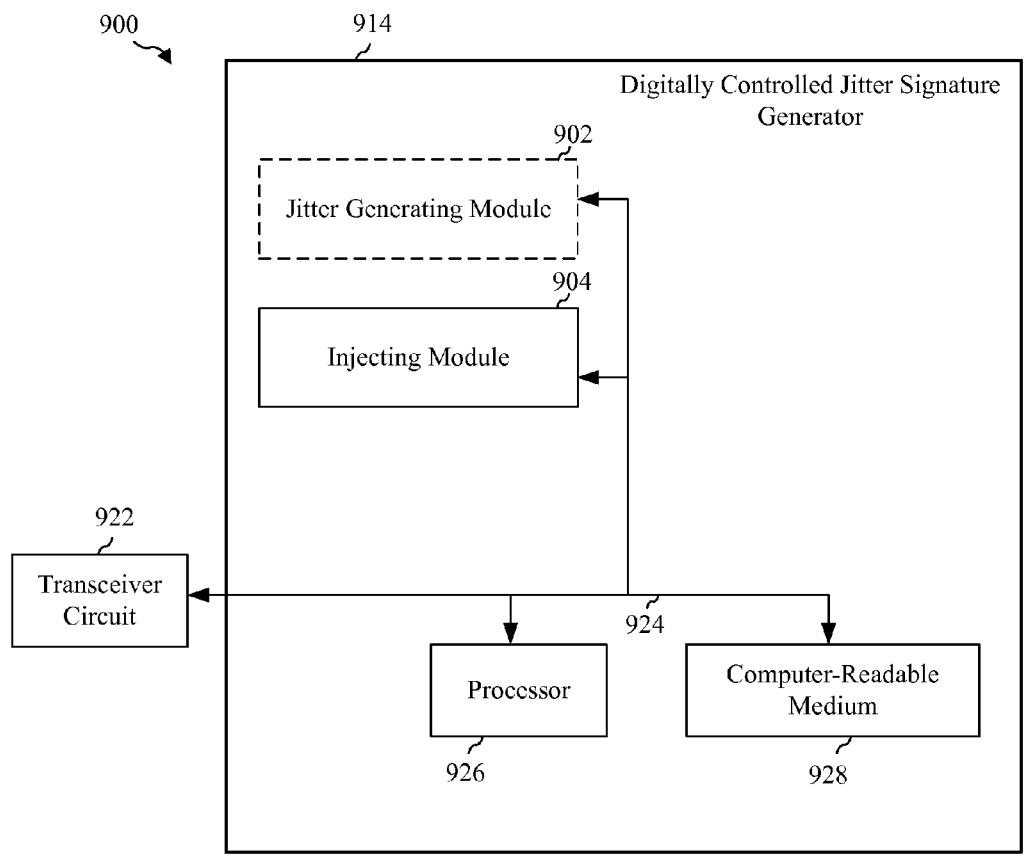
FIG. 9 is a diagram illustrating an example of a hardware implementation for a digitally controlled jitter injection system according to an aspect of the present disclosure.

FIG. 9 is a diagram illustrating an example of a hardware implementation for a digitally controlled jitter injection system 900 employing a transceiver circuit 922 and a digitally controlled signature generator 914. In one aspect, at least a portion or all of the digitally controlled signature generator 914 may be integrated in the transceiver circuit 922. In other aspects, the digitally controlled signature generator 914 may be independent but coupled to the transceiver circuit 922. The digitally controlled signature generator 914 may be implemented with a bus architecture, represented generally by a bus 924. The bus 924 may include any number of interconnecting buses and bridges depending on the specific application of the digitally controlled signature generator 914 and the overall design constraints. The bus 924 links together various circuits including one or more processors and/or hardware modules, represented by a processor 926, a jitter generating module 902 and an injecting module 904, and a computer-readable medium 928. The bus 924 may also link various other circuits such as timing sources, peripherals, voltage regulators, and power management circuits, which are well known in the art, and therefore, will not be described any further.

The apparatus includes the digitally controlled signature generator 914 coupled to the transceiver circuit 922. In some configurations, the transceiver circuit 922 may be coupled to one or more antennas (not shown). The transceiver circuit 922 provides a system to communicate with various other apparatus over a communication channel, e.g., communication channel 102. The digitally controlled signature generator 914 includes the processor 926 coupled to the computer-readable medium 928. The processor 926 is responsible for general processing, including the execution of software (e.g., software 570, 670, or 770) stored on the computer-readable medium 928. The software, when executed by the processor 926, causes the digitally controlled signature generator 914 to perform the various functions described supra for any particular apparatus. The computer-readable medium 928 may also be used for storing data, e.g., composite jitter, which is manipulated by the processor 926 when executing software.

The digitally controlled signature generator 914 further includes the jitter generating module 902 for generating a composite jitter including multi-tone jitter components and the injecting module 904 for digitally injecting the composite jitter into the transceiver circuit. The jitter generating module 902 and the injecting module 904 may be software modules running in the processor 926, resident/stored in the computer readable medium 928, one or more hardware modules coupled to the processor 926, or some combination thereof.

In one configuration, the digitally controlled jitter injection system 900 includes means for generating a composite jitter including multi-tone jitter components. The means may be the jitter generating module 902 and/or the digitally controlled signature generator 914 of the digitally controlled jitter injection system 900 configured to perform the functions recited by the jitter generating means. In another aspect, the aforementioned means may be any module or any apparatus configured to perform the functions recited by the aforementioned means.

In one configuration, the digitally controlled jitter injection system 900 for self-testing a transceiver circuit includes a means for digitally injecting the composite jitter into the transceiver circuit. The means may be the injecting module 904 and/or the digitally controlled signature generator 914 of the digitally controlled jitter injection system 900 configured to perform the functions recited by the means. In another aspect, the aforementioned means may be any module or any apparatus configured to perform the functions recited by the aforementioned means.

Figure 10:
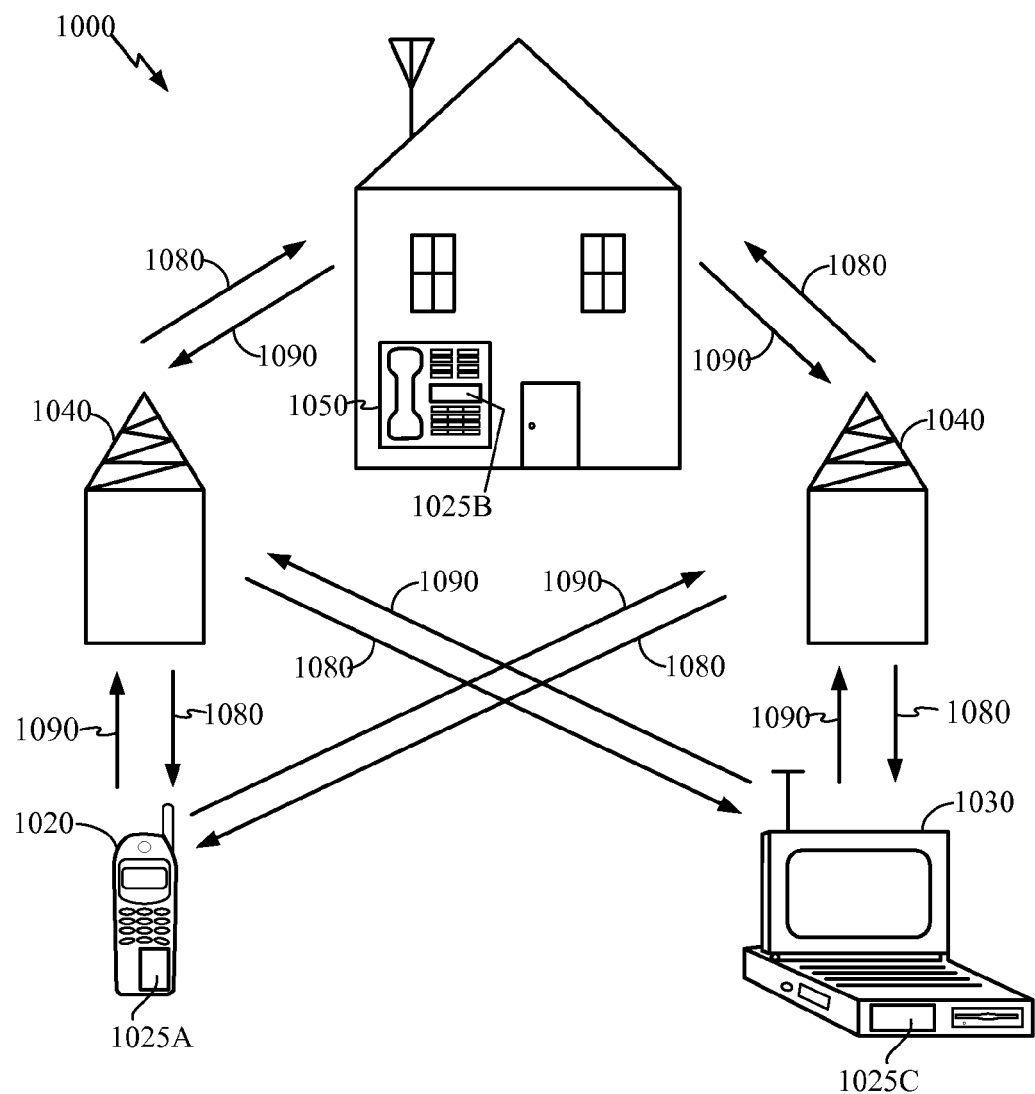
FIG. 10 shows an exemplary wireless communication system in which a configuration of a digitally controlled jitter injection system may be advantageously employed.

FIG. 10 shows an exemplary wireless communication system 1000 in which an embodiment of the digitally controlled jitter injection system may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include the digitally controlled jitter injection system 1025A, 1025B and 1025C. FIG. 10 shows forward link signals 1080 from the base stations 1040 to the remote units 1020, 1030, and 1050 and reverse link signals 1090 from the remote units 1020, 1030, and 1050 to base stations 1040.

In FIG. 10, the remote unit 1020 is shown as a mobile telephone, remote unit 1030 is shown as a portable computer, and remote unit 1050 is shown as a fixed location remote unit in a wireless local loop system. The digitally controlled jitter injection system can be integrated into one or more remote units including cell phones, hand-held personal communication systems (PCS) units, portable data units such as personal data assistants, and/or fixed location data units such as meter reading equipment. Although FIG. 10 illustrates remote units, which may employ a digitally controlled jitter injection system 1025A, 1025B and 1025C according to the teachings of the disclosure, the disclosure is not limited to these exemplary illustrated units. For instance, a digitally controlled jitter injection system according to aspects of the present disclosure may be suitably employed in any device.

Figure 11:
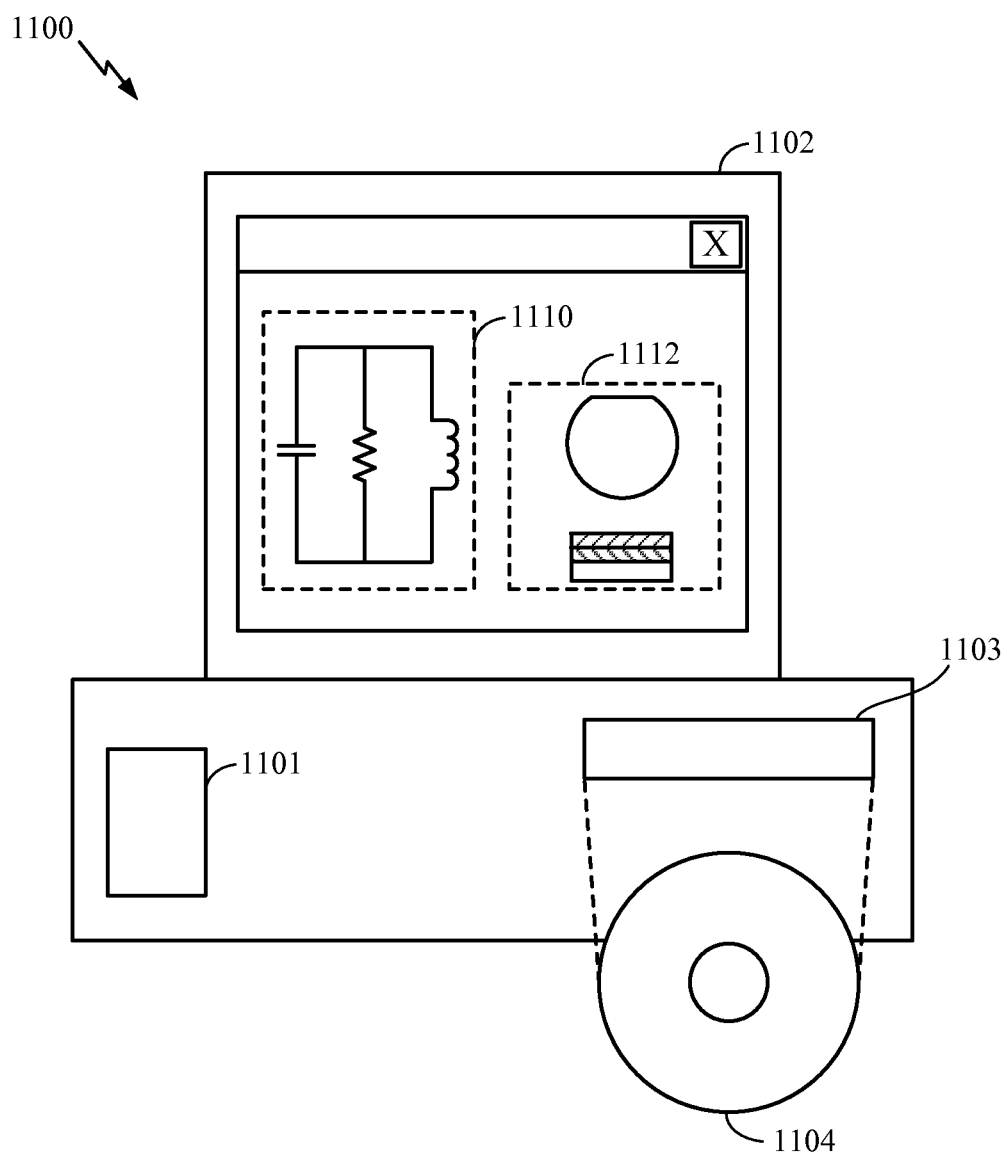
FIG. 11 is a block diagram illustrating a design workstation used for circuit, layout, and logic design of a semiconductor component, such as a digitally controlled jitter injection system.

FIG. 11 is a block diagram illustrating a design workstation used for circuit, layout, and logic design of a semiconductor component, such as the digitally controlled jitter injection system disclosed above. A design workstation 1100 includes a hard disk 1101 containing operating system software, support files, and design software such as Cadence or OrCAD. The design workstation 1100 also includes a display 1102 to facilitate design of a circuit 1110 or a semiconductor component 1112 such as a digitally controlled jitter injection system. A storage medium 1104 is provided for tangibly storing the circuit design 1110 or the semiconductor component 1112. The circuit design 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit design 1110 or the semiconductor component 1112 by decreasing the number of processes for designing semiconductor wafers.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. An apparatus, comprising:
   a transceiver circuit comprising:
   a transmitter circuit configured to transmit a signal;
   a receiver circuit configured to receive the signal;
   a generator configured to generate a composite jitter including a plurality of multi-tone jitter components; and a processor operable to digitally inject the composite jitter into the receiver circuit and/or the transmitter circuit of the transceiver circuit for testing a jitter tolerance associated with the transceiver circuit based on the signal and the injected composite jitter.

2. The apparatus of claim 1, in which the processor is further operable to inject the plurality of multi-tone jitter components within a clock and data recovery loop of the receiver circuit.

3. The apparatus of claim 1, in which the processor is further operable to inject the plurality of multi-tone jitter components within a phase-locked loop (PLL) based clock and data recovery loop of the receiver circuit.

4. The apparatus of claim 1, in which the processor is further operable to inject the plurality of multi-tone jitter components within a phase interpolator based clock and data recovery loop of the receiver circuit.

5. The apparatus of claim 1, in which the composite jitter comprises a phase domain based composite jitter or a frequency domain based composite jitter.

6. The apparatus of claim 1, in which the generator comprises a predefined lookup table of composite jitter parameters and/or a processor for implementing a software configuration to generate the composite jitter parameters.

7. The apparatus of claim 6, in which the predefined lookup table of composite jitter parameters comprises a phase domain based look-up table and/or a frequency domain based look-up table.

8. The apparatus of claim 1, in which the receiver circuit, the transmitter circuit or the transceiver circuit is integrated into a mobile phone, a set top box, a music player, a video player, an entertainment unit, a navigation device, a computer, a hand-held personal communication systems (PCS) unit, a portable data unit, and/or a fixed location data unit.

9. A method of self-testing a transceiver circuit, comprising:
   transmitting a signal by a transmitter circuit of the transceiver circuit;
   receiving the signal by a receiver circuit of the transceiver circuit;
   generating a composite jitter including a plurality of multi-tone jitter components;
   digitally injecting the composite jitter into the receiver circuit and/or the transmitter circuit of the transceiver circuit; and
   testing a jitter tolerance associated with the transceiver circuit based on the signal and the injected composite jitter.

10. The method of claim 9, further comprising:
    driving the plurality of multi-tone jitter components into a receiver communication path injection point.

11. The method of claim 9, further comprising:
    accessing a lookup table comprising a set of frequency and/or phase domain based composite jitter parameters; and
    driving the frequency domain based composite jitter parameters and/or the phase domain based composite jitter parameters into a first receiver communication path injection point and/or a second receiver communication path injection point.

12. The method of claim 9, further comprising integrating the transceiver circuit into a mobile phone, a set top box, a music player, a video player, an entertainment unit, a navigation device, a computer, a hand-held personal communication systems (PCS) unit, a portable data unit, and/or a fixed location data unit.

13. A transceiver circuit, comprising:
    means for transmitting a signal;
    means for receiving the signal;
    means for generating a composite jitter including a plurality of multi-tone jitter components; and
    means for digitally injecting the composite jitter into the means for receiving and/or means for transmitting of the transceiver circuit for testing a jitter tolerance associated with the transceiver circuit based on the signal and the injected composite jitter.

14. The transceiver circuit of claim 13, in which the digitally injecting means further comprises means for injecting the plurality of multi-tone jitter components within a clock and data recovery loop of the means for receiving.

15. The transceiver circuit of claim 13, in which the digitally injecting means further comprises means for injecting the plurality of multi-tone jitter components within a phase-locked loop (PLL) based clock and data recovery loop of the means for receiving.

16. The transceiver circuit of claim 13, in which the digitally injecting means further comprises means for injecting the plurality of multi-tone jitter components within a phase interpolator based clock and data recovery loop of the means for receiving.

17. The transceiver circuit of claim 13, in which the transceiver circuit is integrated into a mobile phone, a set top box, a music player, a video player, an entertainment unit, a navigation device, a computer, a hand-held personal communication systems (PCS) unit, a portable data unit, and/or a fixed location data unit.

18. A computer program product for self-testing a transceiver circuit, comprising:
    a computer-readable medium having non-transitory program code recorded thereon, the program code comprising:
       program code to transmit a signal by a transmitter circuit of the transceiver circuit;
       program code to receive the signal by a receiver circuit of the transceiver circuit;
       program code to generate a composite jitter including a plurality of multi-tone jitter components; and
       program code to digitally inject the composite jitter into the receiver circuit and/or the transmitter circuit of the transceiver circuit for testing a jitter tolerance associated with the transceiver circuit based on the signal and the injected composite jitter.

19. The computer program product of claim 18, in which the program code further comprises code to inject the plurality of multi-tone jitter components within a clock and data recovery loop of the receiver circuit.

20. The computer program product of claim 18, in which the program code further comprises code to inject the plurality of multi-tone jitter components within a phase-locked loop (PLL) based clock and data recovery loop of the receiver circuit.

* * * * *